US012613676B2

(12) United States Patent
Lee et al.

(10) Patent No.: US 12,613,676 B2
(45) Date of Patent: Apr. 28, 2026

(54) MEMORY DEVICES, COMPUTING DEVICES, AND METHODS FOR IN-MEMORY COMPUTING

(71) Applicant: Taiwan Semiconductor Manufacturing Company, Ltd., Hsinchu (TW)

(72) Inventors: Chia-Fu Lee, Hsinchu (TW); Po-Hao Lee, Hsinchu (TW); Yi-Chun Shih, Taipei (TW); Yu-Der Chih, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1019 days.

(21) Appl. No.: 17/663,021

(22) Filed: May 12, 2022

(65) Prior Publication Data

US 2023/0131308 A1      Apr. 27, 2023

Related U.S. Application Data

(60) Provisional application No. 63/271,398, filed on Oct. 25, 2021.

(51) Int. Cl.
| | |
|---|---|
| *G06F 7/544* | (2006.01) |
| *G06F 1/08* | (2006.01) |
| *G11C 7/04* | (2006.01) |
| *G11C 7/22* | (2006.01) |
| *H03K 5/14* | (2014.01) |

(52) U.S. Cl.
CPC .............. *G06F 7/5443* (2013.01); *G06F 1/08* (2013.01); *G11C 7/222* (2013.01); *H03K 5/14* (2013.01); *G11C 7/04* (2013.01)

(58) Field of Classification Search
CPC ......... G06F 1/08; G06F 7/5443; G11C 11/04; G11C 7/222; G11C 7/225; G11C 7/1054; G11C 7/1072; G11C 7/1081; H03K 5/14
See application file for complete search history.

(56) References Cited

U.S. PATENT DOCUMENTS

| | | | | |
|---|---|---|---|---|
| 6,973,001 B1* | 12/2005 | Tomita | .................... | G11C 7/222 |
| | | | | 365/194 |
| 7,940,667 B1 | 5/2011 | Coady et al. | | |
| 2018/0061462 A1* | 3/2018 | Murakami | ........... | G11C 7/1063 |
| 2020/0174786 A1 | 6/2020 | Zhang et al. | | |

(Continued)

FOREIGN PATENT DOCUMENTS

| | | |
|---|---|---|
| CN | 112328166 A | 2/2021 |
| CN | 112447229 A | 3/2021 |

(Continued)

*Primary Examiner* — Emily E Larocque
(74) *Attorney, Agent, or Firm* — Finnegan, Henderson, Farabow, Garrett & Dunner, L.L.P.

(57) ABSTRACT

A memory device includes a computing-in-memory macro and a clock generating circuit. The computing-in-memory macro is configured to perform in-memory computing based on a first clock signal. The clock generating circuit is arranged within the computing-in-memory macro and configured to generate the first clock signal. A frequency of the first clock signal is modified according to a condition of the computing-in-memory macro to cause the first clock signal to conform to an operation speed of the in-memory computing.

20 Claims, 7 Drawing Sheets

(56) References Cited

U.S. PATENT DOCUMENTS

| | | |
|---|---|---|
| 2021/0247797 A1 | 8/2021 | Gu et al. |
| 2021/0286594 A1 | 9/2021 | Lee et al. |

FOREIGN PATENT DOCUMENTS

| | | |
|---|---|---|
| CN | 112567350 A | 3/2021 |
| CN | 112711394 A | 4/2021 |
| JP | 2008067245 A | 3/2008 |
| KR | 10-2010-0052665 A | 5/2010 |
| TW | I705391 B | 9/2020 |

* cited by examiner

100

110

| CIM memory array 210 | WL Driver 230 | CIM memory array 210 |
|---|---|---|
| SRAM R/W 240 | 220 140 | SRAM R/W 240 |
| CIM memory array 210 | WL Driver 230 | CIM memory array 210 |
| SRAM R/W 240 | 220 140 | SRAM R/W 240 |

100

140

MEMORY DEVICES, COMPUTING DEVICES, AND METHODS FOR IN-MEMORY COMPUTING

REFERENCE TO RELATED APPLICATION

This application claims the benefit of U.S. Provisional Application No. 63/271,398, filed on Oct. 25, 2021, entitled "MEMORY DEVICE FOR COMPUTING IN MEMORY," the entirety of which is incorporated by reference herein.

BACKGROUND

This disclosure relates generally to memory arrays used in data processing, such as multiply-accumulate operations. Computing-in-memory ("CIM," or in-memory computing) systems store information in random-access memory (RAM) of computers and perform calculations at a memory cell level, rather than moving large data between the RAM and data storing units for each computation step. Compute-in-memory systems allow data to be analyzed in real time because the data stored in RAM can be quickly accessed, which enables faster reporting and decision-making in machine learning applications.

BRIEF DESCRIPTION OF THE DRAWINGS

Aspects of the present disclosure are best understood from the following detailed description when read with the accompanying figures. It is noted that, in accordance with standard practice in the industry, various features are not drawn to scale. In fact, the dimensions of the various features may be arbitrarily increased or reduced for clarity of discussion.

DETAILED DESCRIPTION

Figures 1, 2:
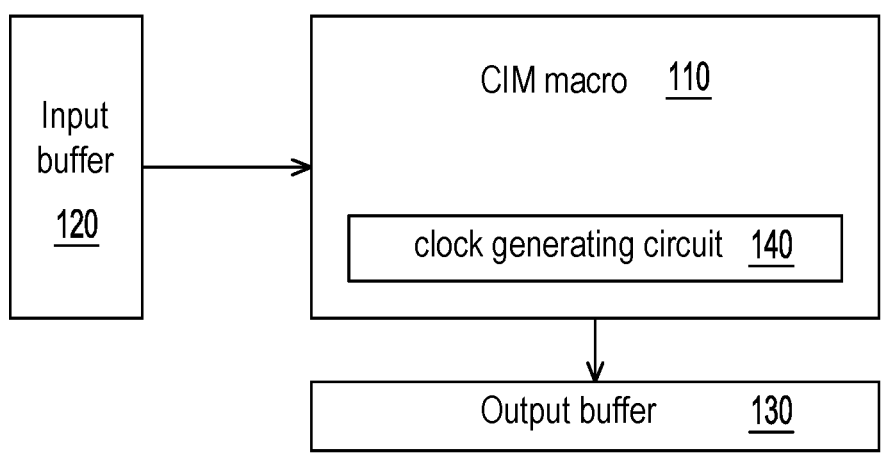
FIG. 1 is a diagram of an exemplary memory device, in accordance with some embodiments of the present disclosure.
FIG. 2 is a diagram of an exemplary CIM macro, in accordance with some embodiments of the present disclosure.

The following disclosure provides many different exemplary embodiments, or examples, for implementing different features of the presently disclosed subject matter. Specific simplified examples of components and arrangements are described below to explain the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected". "Coupled" and "connected" may also be used to indicate that two or more elements cooperate or interact with each other.

Various embodiments of the present disclosure will be described with respect to embodiments in a specific context, namely computing-in-memory ("CIM") applications. An example of CIM applications is multiply accumulate ("MAC") operations. In MAC operations, numbers in an input array (e.g., a row) are multiplied, or "weighted," by respective elements in another array (e.g., a column) of numbers (e.g., weights), and the products are added together (accumulated) by an accumulator to compute an output sum. This operation is mathematically similar to a dot product (i.e., a scalar product) of two vectors. In the dot product operation, the dot product of two vectors is defined as the sum of the products of component pairs, in which components of two vectors are pair-wise multiplied with each other.

FIG. 1 is a diagram of a memory device 100 in accordance with some embodiments of the present disclosure. In some embodiments, the memory device 100 can function as a computing device to perform in-memory computing. As shown in FIG. 1, the memory device 100 includes a CIM macro 110, an input buffer circuit 120 coupled with the CIM macro 110, and an output buffer circuit 130 coupled with the CIM macro 110. In some embodiments, the input buffer circuit 120 and the output buffer circuit 130 can be implemented as static random access memory (SRAM) units. A clock generating circuit 140 is arranged within the CIM macro 110 and configured to generate one or more clock signals for the in-memory computing.

In some embodiments, the CIM macro 110 may be an SRAM macro. In an SRAM device, data can be written to, and read from, each SRAM cell, via one or more bit lines ("BLs"), upon activation of one or more access transistors in the SRAM cell by enabling signals from one or more word lines ("WLs"). While an SRAM macro is used as an example in this disclosure, it will be appreciated that other types of memories are within the scope of various embodiments. The CIM macro 110 of FIG. 1 can be a CIM device configured to perform various in-memory computations, such as multiply accumulate (MAC) operations. For example, the memory device 100 may receive input signals and multiply numbers indicated by the input signals by respective weights stored in storage cells in the CIM macro 110. Then, the CIM macro 110 may add the products by an accumulator to obtain output signals indicating an output sum. Particularly, in an SRAM-based CIM design, multiple word lines associated with a column of SRAM cells can be turned on to discharge a common bit line, such as a read bit line ("RBL") to implement a 1-bit MAC operation.

MAC operations are the primary calculations used in artificial intelligence (AI) at the chip level for training and the operation of neural networks. In some AI systems, such as artificial neural networks, an array of data, i.e., numbers, can be weighted by multiple columns of weights. The weighting by each column of weights produces a respective output sum. Accordingly, an artificial intelligence system may produce an output array of sums from an input array of data, i.e., numbers, multiplied by the weights in a matrix of multiple columns of weights. In other words, the AI system may map inputs to outputs based on a set of the weights. In some applications, such as multi-bit convolutional neural network ("CNN") operations, similar operations are employed. When the AI system trains a neural network, the neural network may use various algorithms to update the weights used in MAC operations to develop a proper set of weights enabling the neural network to classify the data correctly.

In some embodiments, the input buffer circuit 120 may store input data (e.g., input feature maps to be processed) received from external circuits (e.g., a main memory), and provide the stored input data to the CIM macro 110 for a computation. The CIM macro 110 stores weight values for the MAC computation, and, with the input data provided by the input buffer circuit 120, memory arrays and logic circuits within the CIM macro 110 perform the multiplication and accumulation to obtain the computation result. Accordingly, the output data obtained after the computation can be provided to and stored in the output buffer circuit 130. The output buffer circuit 130 may then communicate with external circuits (e.g., a main memory) and send the final computation output to external circuits.

FIG. 2 is a diagram of an exemplary CIM macro 110 in accordance with some embodiments of the present disclosure. As shown in FIG. 2, the CIM macro 110 includes one or more CIM memory arrays 210, one or more control circuits 220 having the clock generating circuit 140, and driver circuits 230, 240. In some embodiments, CIM memory arrays 210 may include a plurality of memory segments. Each memory segment may include memory banks. Storage cells in a memory bank are arranged in rows and columns. Accordingly, storage cells in a memory segment and in the memory array 210 are also arranged in rows and columns.

The one or more control circuits 220 may include a global control circuit and local control circuits for controlling memory operations in the one or more CIM memory arrays 210. For example, the global control circuit may provide the row address, the column address pre-decode, clock, and other signals used in the CIM macro 110. The global control circuit can also communicate with an input-output (I/O) circuit to control data transfer between the one or more CIM memory arrays 210 and external circuits. For example, the one or more control circuits 220 may generate a column select signal to select a column to be pre-charged or to be read in the one or more CIM memory arrays 210 based on the clock signal and an address of the storage cell to be read.

In some embodiments, each driver circuit 230 includes an input activation driver and an SRAM word line (WL) driver. For example, the input activation driver may provide inputs from the input buffer circuit 120 into the CIM memory array(s) 210, and the SRAM word line (WL) driver may provide word line signals to corresponding word lines of the one or more CIM memory arrays 210. For example, the inputs may be simultaneously fed into the CIM memory array(s) 210 in an MSB-first bit-serial manner.

In some embodiments, the driver circuits 240 include SRAM read/write circuits configured to communicate with corresponding storage cells within the CIM memory array(s) 210 to perform read or write operations to update the weight values stored in the CIM memory array(s) 210. The CIM macro 110 may also include other circuit elements, such as decoders, or other input-output (I/O) circuits for transferring data between storage cells in corresponding CIM memory array(s) 210 and external circuits outside of the CIM macro 110.

When the CIM macro 110 performs MAC operations, the operating speed of the MAC operations is sensitive to variations in PVT (process, voltage and temperature) conditions, which may introduce inaccuracy or errors in accumulation functions in the MAC operations. For example, when the CIM macro 110 operates with different voltage conditions, the MAC operating speed with a relatively high voltage may be faster than the MAC operating speed with a relatively low voltage. Similarly, when the CIM macro 110 operates with different temperature conditions, the MAC operating speed with a relatively high temperature may be faster than the MAC operating speed with a relatively low temperature. In addition, unexpected dynamic voltage (IR) drop may also impact the operating speed of MAC operations. Accordingly, when the CIM macro 110 performs the MAC operation with low power, the MAC operating speed may be slower.

When the MAC operation speed is lower than a clock frequency in the CIM macro 110 performing the MAC operation, the CIM macro 110 is unable to perform the accumulation function properly, which causes errors in the MAC operation. In various embodiments of the present disclosure, the clock generating circuit 140 within the control circuit 220 can provide an internal clock with the frequency that is adjustable and modifiable dynamically according to the PVT (process, voltage and temperature) conditions of the CIM macro 110 automatically to prevent the errors. The CIM macro 110 performs in-memory computing based on the internal clock generated by the clock generating circuit 140. For example, the CIM macro 110 may exchange data with external circuits based on the internal clock.

Figure 3:
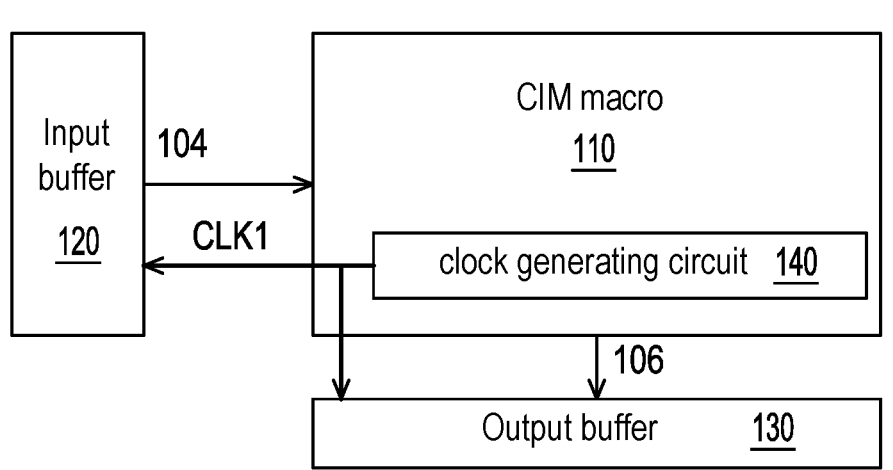
FIG. 3 is a diagram illustrating exemplary operations of a clock generating circuit, in accordance with some embodiments of the present disclosure.

FIG. 3 is a diagram illustrating exemplary operations of the clock generating circuit 140, in accordance with some embodiments of the present disclosure. As shown in FIG. 3, the clock generating circuit 140 in the CIM macro 110 is configured to generate a clock signal CLK1 for the MAC operation, so that the CIM macro 110 performs the MAC operation based on the clock signal CLK1. For example, the CIM macro 110 may receive input data 104 from the input buffer circuit 120 according to the clock signal CLK1, and provide output data 106 to the output buffer circuit 130 according to the clock signal CLK1.

In some embodiments, the frequency of the clock signal CLK1 can be modified according to a condition (e.g., PVT conditions) of the CIM macro 110 to cause the clock signal CLK1 to conform to an operation speed of the MAC operation. Particularly, the frequency of the clock signal CLK1 can be associated with one or more PVT conditions of the CIM macro 110, to ensure the frequency of the clock signal CLK1 is within a desired range corresponding to the MAC operation speed. In some embodiments, the frequency of the clock signal CLK1 is equal to or less than the MAC operation speed. For example, the clock generating circuit 140 may include PVT-dependent components, such as NMOS or PMOS transistors. The propagation delay caused by the PVT-dependent components within the clock generating circuit 140 depends on PVT variations. Accordingly, the signal passing through the PVT-dependent components automatically adjusts in response to different PVT conditions or unexpected power IR-drop, implementing clock throttling such that the clock generating circuit 140 outputs the clock signal CLK1 that conforms the MAC operation speed.

By the clock throttling described above, the clock generating circuit 140 can track the environment (e.g., voltage and temperature) and process of the CIM macro 110 using PVT-dependent components, to allow efficient data transfer to or from the CIM macro 110 and achieve a dynamic clocking. More particularly, the clock generating circuit 140 may adjust the generated clock signal CLK1 in response to the changes in environmental conditions (e.g., voltage and temperature) and process. By this dynamic clock signal CLK1, the CIM macro 110 can perform the MAC operations accordingly to maximize operation performance under different operating conditions.

In comparison, without the dynamic clocking function by the clock generating circuit 140, the MAC operations can only be operated according to a fixed clock signal based on a worst-case scenario, which may be different from the actual operating conditions. As a result, the MAC operations and the data transfer are less efficient without the clock generating circuit 140 generating the dynamic clock signal CLK1.

Figure 4:
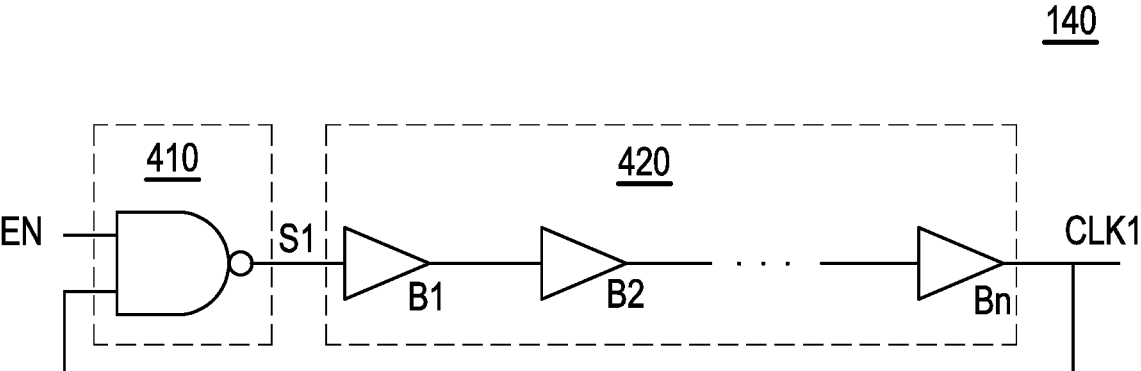
FIG. 4 is a diagram illustrating an exemplary clock generating circuit of the CIM macro of FIG. 2, in accordance with some embodiments of the present disclosure.

FIG. 4 is a diagram of an exemplary configuration of the clock generating circuit 140 shown in FIG. 2, in accordance with some embodiments of the present disclosure. As shown in FIG. 4, in some embodiments, the clock generating circuit 140 includes a NAND logic circuit 410 and a delay line circuit 420. The NAND logic circuit 410 performs a NAND operation based on an enable signal EN and the clock signal CLK1 fed back from an output node of the clock generating circuit 140, to output a gate output signal S1 to the delay line circuit 420. The delay line circuit 420 is configured to receive the gate output signal S1 and modify the gate output signal S1 to generate the clock signal CLK1 by delaying the gate output signal S1.

In some embodiments, the delay line circuit 420 includes multiple delay elements (e.g., buffers) B1, B2, . . . , Bn coupled in series with each other. Each of the delay elements B1, B2, . . . , Bn is configured to delay the output of its input signal and output the delayed signal to a next stage. Accordingly, the first delay element B1 in the series receives the gate output signal S1 and the nth delay element Bn in the series outputs the clock signal CLK1 which is a delayed signal in response to the gate output signal S1. The delay elements B1, B2, . . . , Bn in the delay line circuit 420 include PVT-dependent components, such as NMOS transistors or PMOS transistors, which provide the delay associated with the PVT condition(s). Accordingly, the propagation delay of the delay elements B1, B2, . . . , Bn depends on PVT variations. Because the clock generating circuit 140 is integrated within the CIM macro 110, the generated clock signal CLK1 conforms to the computation performed by the CIM macro 110. For example, the number of the delay elements B1, B2, . . . , Bn can be associated with the stage number of CIM macro 110. Thus, the clock signal CLK1 for the MAC operations is delayed to cause the clock signal CLK1 to conform the MAC operation speed dependent on PVT conditions, or unexpected power IR-drop.

Particularly, when the enable signal EN received at one input of the NAND logic circuit 410 is disabled (e.g., at logical low), the gate output signal S1 at an output of the NAND logic circuit 410 goes logical high (e.g., 1), regardless of the other input. Thus, the clock signal CLK1, which is the signal delayed by the delay line circuit 420, also goes logical high (e.g., 1), reaching a steady state.

When the enable signal EN is enabled (e.g., shifted to logical high), in response to both the enable signal EN and the feedback clock signal CLK1 being high, the gate output signal S1 at the output of the NAND logic circuit 410 is shifted to logical low (e.g., 0). After a delay period, the clock signal CLK1 is also shifted to logical low (e.g., 0). The clock signal CLK1 switching to logical low triggers the NAND logic circuit 410 to output the gate output signal S1 being logical high (e.g., 1). Thus, the clock signal CLK1, after another delay period, switches from logical low to logical high again, triggering another cycle. Accordingly, the clock generating circuit 140 generates the periodic clock signal CLK1 when the enable signal EN is enabled.

In summary, the clock generating circuit 140 generates the clock signal CLK1 corresponding to one or more process-voltage-temperature (PVT) conditions, such as a process condition, a voltage condition, a temperature condition, a power IR-drop condition, or any combination thereof. The clock generating circuit 140 may adjust the frequency of the clock signal CLK1 in response to the PVT conditions of the CIM macro 110, and provide a dynamically modified clock signal CLK1 to the input buffer circuit 120 and the output buffer circuit 130 for performing MAC operations. Thus, the clock generating circuit 140 is configured to provide sufficient delay for low speed operations or low frequency signals, and a relatively small delay for high speed operations, under different environmental conditions (e.g. voltage and temperature) and process to allow the memory device 100 to optimize performance, provide efficient data transfer, and ensure the MAC operations are performed properly.

Figure 5:
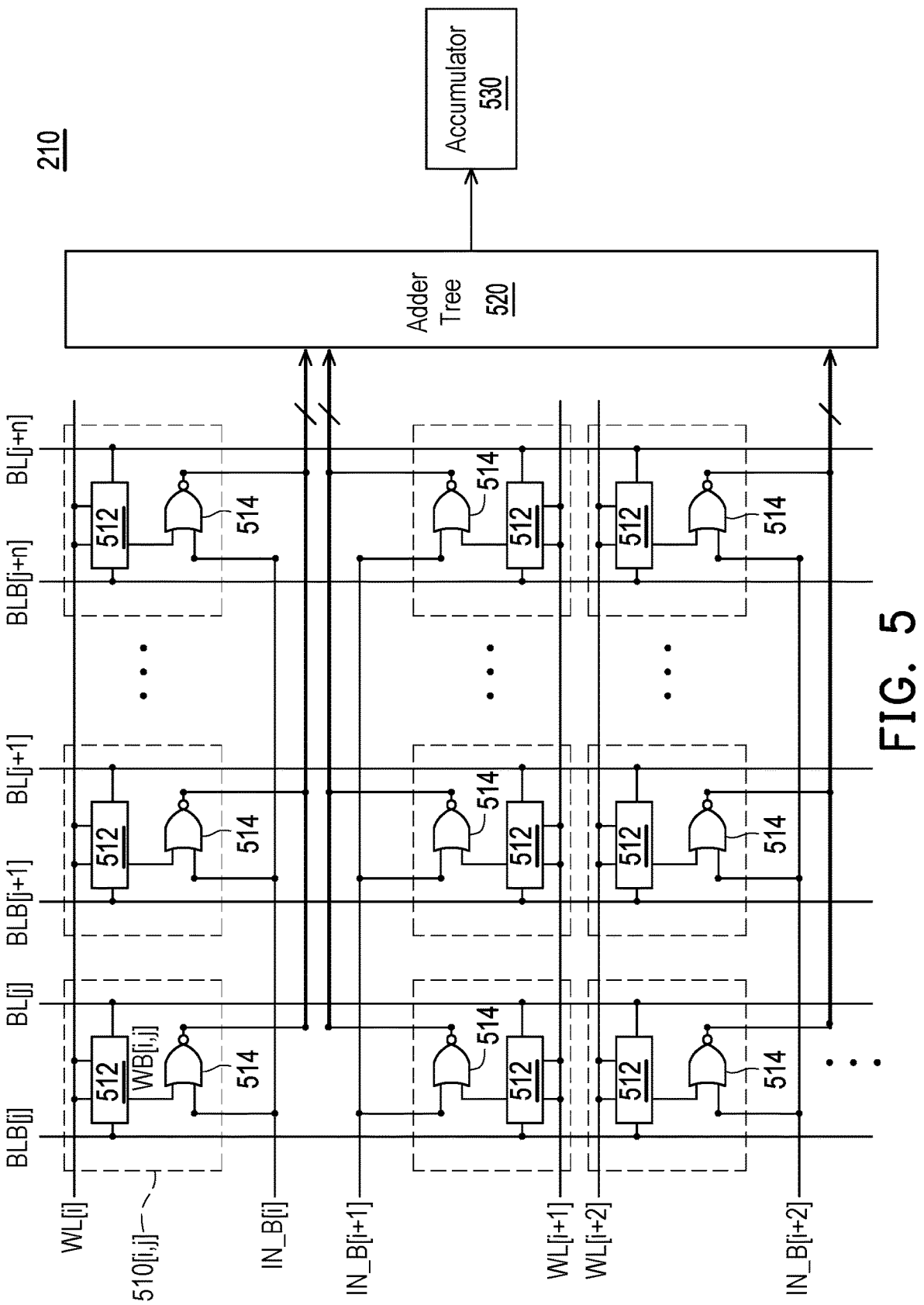
FIG. 5 is a block diagram illustrating an exemplary memory array of FIG. 2, in accordance with some embodiments of the present disclosure.

FIG. 5 is a block diagram illustrating an exemplary configuration of the CIM memory array 210 shown in FIG. 2, in accordance with some embodiments of the present disclosure. As shown in FIG. 5, the memory array 210 having multiple rows and columns of sub-CIM units 510. In some embodiments, the memory array 210 includes 64 columns to provide 64 partial-sum outputs, and sub-CIM units 510 in the same column are respectively coupled to 256 input lines to receive the input data. In the embodiment of FIG. 5, each sub-CIM unit 510 includes an SRAM cell 512 for storing data (e.g., a corresponding weight) for multiply accumulate operation, and a bit-wise multiplier 514 for performing multiplication operations. In some embodiments, one SRAM cell can be achieved by a 6T-based SRAM memory cell, and its associated multiplier 514 can be achieved by a 4T-based NOR gate configured to perform bitwise multiplication. Outputs of sub-CIM units 510 in the same column are provided to a parallel adder tree 520 and a partial-sum accumulator 530 for performing accumulation operations.

The sub-CIM unit 510 associated with the corresponding row i and corresponding column j is used as an example to describe, in the following paragraphs, the structure and circuit of the sub-CIM unit 510 and the operations with respect to corresponding signal lines. As shown in FIG. 5, for the sub-CIM unit 510[$i,j$], the storage cell 512 is connected to the word line WL[i] associated with the row i and the bit line BL[j] and the bit line bar BLB[j] associated with the column j. When activated by the signal on the word line WL[i], the storage cell 512 may be configured to input a binary signal indicative a weight ("W") (0 or 1) according to the values of the bit line BL[j] and the bit line bar BLB[j], and update the weight accordingly. For example, the weight can be previously calculated or updated by an AI algorithm and written in the storage cell 512 for the MAC computation.

The multiplier 514 receives a weight bar value (e.g., WB[i,j]) from the storage cell 512 and an input bar value from an associated input line bar IN_B[i]. Accordingly, the value outputted by the multiplier 514 is determined by both the data from the input line and the weight stored in the storage cell 512. When the signal on the input line IN[i] is logical high ("1") (i.e., the input line bar IN_B[i] being 0), the output of the multiplier 514 is the inverted value (i.e., the weight value) of the weight bar value (e.g., WB[i,j]). When the signal on the input line IN[i] is logical low ("0") (i.e., the input line bar IN_B[i] being 1), a "O" is outputted, regardless of the weight stored in the storage cell 512. Thus, the output of the multiplier 514 is the multiplication of the input signal and the weight stored in the storage cell 512 and can be given by the following Table 1:

TABLE 1

| Input | Weight | Output |
|-------|--------|--------|
| 0 | 0 | 0 |
| 0 | 1 | 0 |
| 1 | 0 | 0 |
| 1 | 1 | 1 |

For example, in some embodiments, 256 sub-CIM units 510 in the same column are configured to respectively perform 256 multiplications based on the input data and corresponding weights in one cycle. As shown in FIG. 5, in one sub-CIM unit 510, the multiplier 514 is electrically connected to a corresponding input line bar ("IN_B") to receive the input data, and multiplies the input data with the corresponding weight stored in the associated SRAM cell 512 coupled to the multiplier 514. The sub-CIM units 510 send the results of multiplications in the adder tree 520 to generate a partial sum. After four cycles, the partial-sum accumulator 530 is configured to accumulate the partial sums of each cycle in a pipelined manner to complete the accumulation. The partial-sum accumulator 530 may output the final result to the output buffer circuit 130.

When applied to AI applications using a multiply accumulate system as a model, the CIM macro 110 can supply a set of input data (i.e., numbers), via the input line IN[i], to the current model. The input data are processed by multiplying each input with the corresponding weight stored in the memory array 210 and accumulating the products together to obtain the output data. The output data are then compared to a target or desired output voltage. If the output data are not close enough to the desired values, the model system is adjusted and the process is repeated until the output data are sufficiently close to the desired values. For example, the CIM macro 110 can include a two-dimensional array of elements arranged in rows and columns, each of the elements storing a weight, and capable of receiving an input and generating an output that is the arithmetic product of the input and the stored weight. The model system can have each input supplied to a row of elements and the outputs of each column of the elements added together.

As neural networks may have various topologies and bit-width precisions, the memory device 100 with the CIM structure can support different neural networks, using multiple macros, either in parallel, serial, or 2D arrays. For example, 3 cascaded CIM memory arrays 210 can support a convolution operation of a 3×3 filter with 64 channels. In addition, weight updates can be performed concurrently with each MAC operation.

Figure 6:
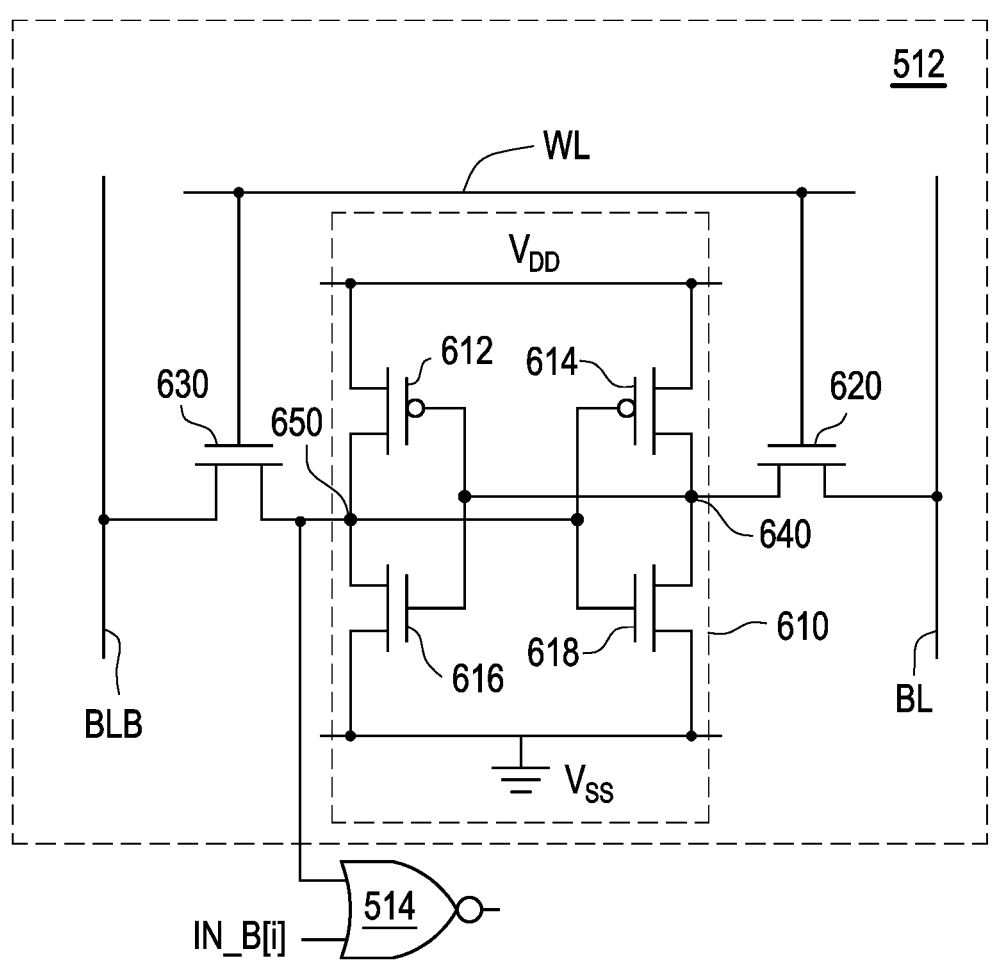
FIG. 6 is a schematic diagram of an exemplary storage cell, in accordance with some embodiments of the present disclosure.

FIG. 6 is a schematic diagram of an exemplary storage cell 512 in accordance with some embodiments of the present disclosure. In some embodiments, the storage cell 512 is a six transistor (6T) single port (SP) SRAM memory cell, which can be used to implement the memory cells 512 illustrated in FIG. 5. In some other embodiments, the storage cell 512 employs a number of transistors other than six. For example, in some other embodiments, the storage cell 512 may be achieved by an 8T SRAM bit cell, a 10T SRAM bit cell, or any other types of memory cell. The 6T SRAM cell 512 illustrated in FIG. 6 is exemplary and used to explain the features, but not meant to limit the embodiments of the present disclosure.

As shown in FIG. 6, the storage cell 512 includes a pair of cross-coupled inverters 610, and access transistors 620 and 630 (also known as a pass gate or a pass transistor). The pair of cross-coupled inverters 610 includes two p-type metal oxide semiconductor (PMOS) transistors 612, 614, and two n-type metal oxide semiconductor (NMOS) transistors 616, 618. Source terminals of the PMOS transistors 612, 614 are electrically connected to a power supply voltage (VDD) terminal. Drain terminals of the PMOS transistors 612, 614 are respectively electrically connected to drain terminals of the NMOS transistors 616, 618 at corresponding nodes 640 and 650. In some embodiments, the multiplier 514 in FIG. 5 is coupled to the node 650 and receives the weight bar value from the node 650 of the storage cell 512.

Source terminals of NMOS transistors 616, 618 are electrically connected to a reference node. As shown in FIG. 6, in some embodiments, the reference node is substantially equal to a logically low signal. For example, the reference node may be substantially equal to a ground voltage (VSS). A gate terminal of PMOS transistor 612 is electrically connected to a gate terminal of NMOS transistor 616 and the respective source/drain terminals of NMOS transistor 618 and PMOS transistor 614. Similarly, a gate terminal of PMOS transistor 614 is electrically connected to a gate terminal of NMOS transistor 618 and the respective source/drain terminals of NMOS transistor 616 and PMOS transistor 612.

The PMOS transistors 612 and 614 can be referred to as pull-up transistors and NMOS transistors 616 and 618 can be referred to as pull-down transistors. Particularly, the PMOS transistors 612 and 614 are configured to pull voltage potential towards the power supply voltage VDD. The NMOS transistors 616 and 618 are configured to pull voltage potential towards the reference node (e.g., the ground voltage VSS).

The access transistor 620 is configured to selectively connect cross-coupled inverters 610 to the bit line BL. The access transistor 630 is configured to selectively connect the cross-coupled inverters 610 to the bit line bar BLB. The access transistor 620 and the access transistor 630 are both configured to be activated based on a signal on the word line WL. As shown in FIG. 6, in some embodiments, the access transistor 620 and the access transistor 630 may be NMOS transistors having gate terminals electrically connected to the word line WL, but the present disclosure is not limited thereto. In other embodiments, the access transistor 620 and the access transistor 630 may be implemented by PMOS transistors.

For the storage cell 512 in FIG. 6 having NMOS transistors for the access transistors 620 and 630, the storage cell 512 is connected to the bit line BL or the bit line bar BLB by a logical high signal at the gate terminal of the access transistor 620 or the access transistor 630. In contrast, if the storage cell 512 instead includes PMOS transistors for the access transistors 620 and 630, the storage cell 512 is connected to the bit line BL or the bit line bar BLB by a logical low signal at the gate terminal of the access transistor 620 or the access transistor 630.

In various embodiments, the storage cell 512 can be of any suitable physical structure. For example, and without limitation, the transistors 612, 614, 616, 618, 620, and 630 in the storage cell 512 can include three-dimensional gate structures, such as fin field-effect-transistors (FinFET).

Figure 7:
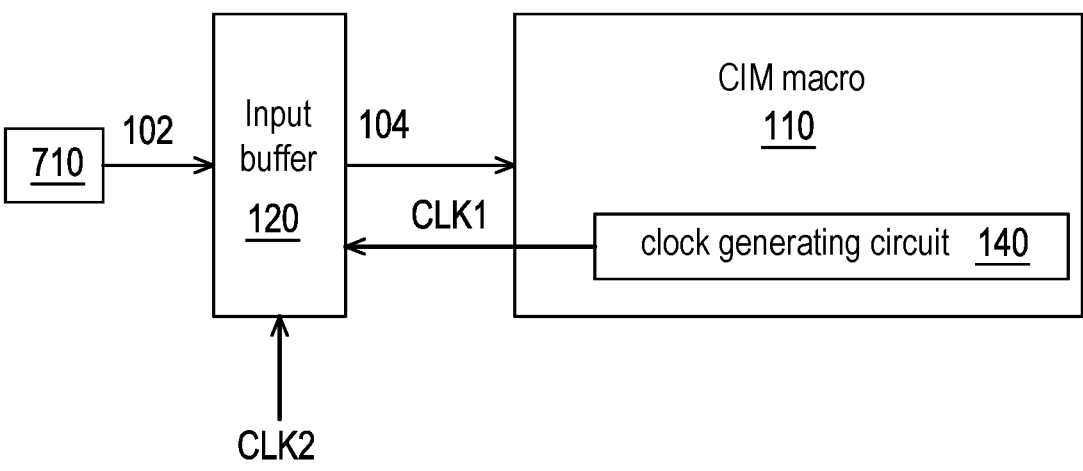
FIG. 7 is a diagram illustrating exemplary communications between the CIM macro and an input buffer circuit, in accordance with some embodiments of the present disclosure.

FIG. 7 is a diagram illustrating exemplary communications between the CIM macro 110 and the input buffer circuit 120 in accordance with some embodiments of the present disclosure. As shown in FIG. 7, in some embodiments, the input buffer circuit 120 is configured to receive input data 102 from one or more external circuits, via an input channel 710 of the memory device 100, and output the received input data 104 to the CIM macro 110 for performing the MAC operations. For example, based on a write clock signal, the input data 102 can be first transferred or fetched into the input buffer circuit 120. Then, in response to a read command based on a read clock signal provided to the input buffer circuit 120, the fetched data stored in the input buffer circuit 120 are provided from the input buffer circuit 120 to the CIM macro 110 accordingly.

In some embodiments, the input buffer circuit 120 may be a first-in-first-out (FIFO) buffer, but the present disclosure is not limited thereto. In some embodiments, the input buffer circuit 120 receives two different clock signals to achieve the data transfer between the input channel 710 and the CIM macro 110. For example, the input buffer circuit 120 may receive the input data 102 based on a system clock signal CLK2, and output the input data 104 into the CIM macro 110 based on the clock signal CLK1. In some embodiments, the internal clock signal CLK1 for the CIM macro 110 and the system clock signal CLK2 may be asynchronous clock signals. Alternatively stated, the input buffer circuit 120 may be an asynchronous FIFO using the system clock signal CLK2 as the write clock signal, and using the internal clock signal CLK1 as the read clock signal that is asynchronous from the write clock signal, so the input buffer circuit 120 inputs data from the input channel 710 in accordance with the write clock signal and outputs data to the CIM macro 110 in accordance with the read clock signal.

In some embodiments, the input buffer circuit 120 may be part of an input interface of the memory device 100. For example, the input interface of the memory device 100 may further include digital counters and drivers. Each counter is configured to output a number of pulses in one counting cycle. The number of pulses corresponds to a number at the counter input. For example, an input of $0000_2$ (i.e., $0_{10}$) generates 0 pulses, an input of $0010_2$ (i.e., $2_{10}$) generates 2 pulses, an input of $1111_2$ (i.e., $15_{10}$) generates 15 pulses, and so on. In other words, in some embodiments, the number of pulses represents the decimal notation of a 4-bit binary number at the counter input. The driver corresponding to the counter is configured to drive the corresponding read wordline of the memory device 100 according to the pulses outputted from the counter accordingly.

Figure 8:
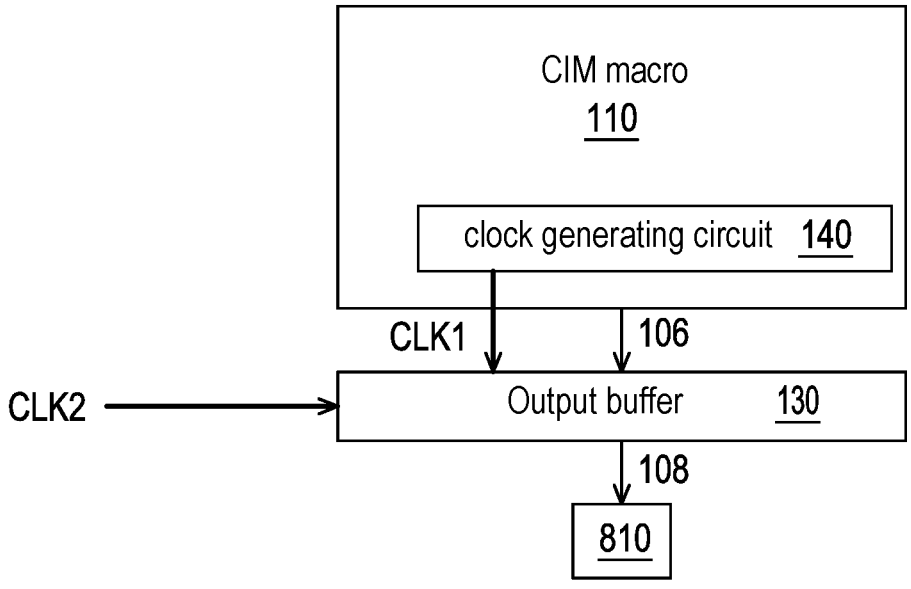
FIG. 8 is a diagram illustrating exemplary communications between the CIM macro and an output buffer circuit, in accordance with some embodiments of the present disclosure.

FIG. 8 is a diagram illustrating exemplary communications between the CIM macro 110 and the output buffer circuit 130 in accordance with some embodiments of the present disclosure. As shown in FIG. 8, in some embodiments, the output buffer circuit 130 is configured to receive output data 106 outputted from the CIM macro 110, and output the received output data 108, via an output channel 810, to one or more external circuits communicating with the output channel 810.

In some embodiments, similar to the input buffer circuit 120 in FIG. 7, the output buffer circuit 130 may also be a first-in-first-out (FIFO) buffer, but the present disclosure is not limited thereto. In some embodiments, the output buffer circuit 130 also receives two different clock signals to achieve the data transfer between the output channel 810 and the CIM macro 110. For example, the output buffer circuit 130 may receive the output data 106 from the CIM macro 110 based on the internal clock signal CLK1 for the CIM macro 110, and output the output data 108 into the output channel 810 based on the system clock signal CLK2, which is an asynchronous clock signal with respect to the internal clock signal CLK1. Alternatively stated, the output buffer circuit 130 may be an asynchronous FIFO using the internal clock signal CLK1 as a write clock signal, and using the system clock signal CLK2 as a read clock signal that is asynchronous from the write clock signal, so the output buffer circuit 130 inputs data from the CIM macro 110 in accordance with the write clock signal and outputs data to the output channel 810 in accordance with the read clock signal.

Figure 9:
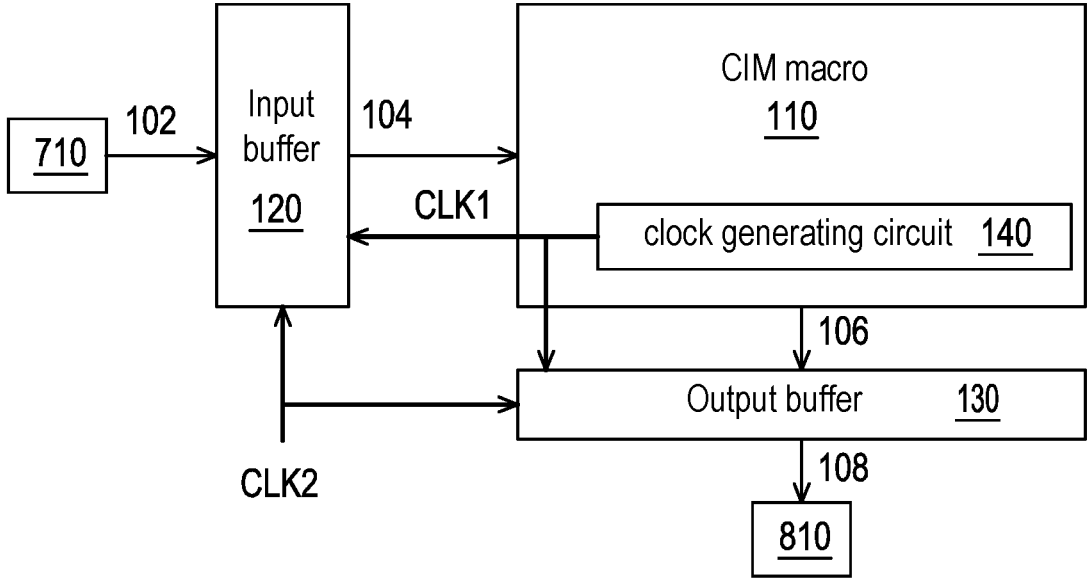
FIG. 9 is a diagram illustrating exemplary communications among the CIM macro, the input buffer circuit, and the output buffer circuit, in accordance with some embodiments of the present disclosure.

FIG. 9 is a diagram illustrating exemplary communications among the CIM macro 110, the input buffer circuit 120, and the output buffer circuit 130, in accordance with some embodiments of the present disclosure. As shown in FIG. 9, in some embodiments, the input buffer circuit 120 and the output buffer circuit 130 may respectively receive the input data 102 from the input channel 710 and output the output data 108 to the output channel 810 based on the same system clock signal CLK2. The clock generating circuit 140 communicates with both the input buffer circuit 120 and the output buffer circuit 130, and generates the clock signal CLK1 so that the input buffer circuit 120 and the output buffer circuit 130 can transmit the input data 104 and the output data 106 of the CIM macro 110 based on the same clock signal CLK1. It will be appreciated that the input buffer circuit 120 and the output buffer circuit 130 illustrated in FIG. 7, FIG. 8, and FIG. 9 are used as an example and not to limit the disclosure.

Figure 10:
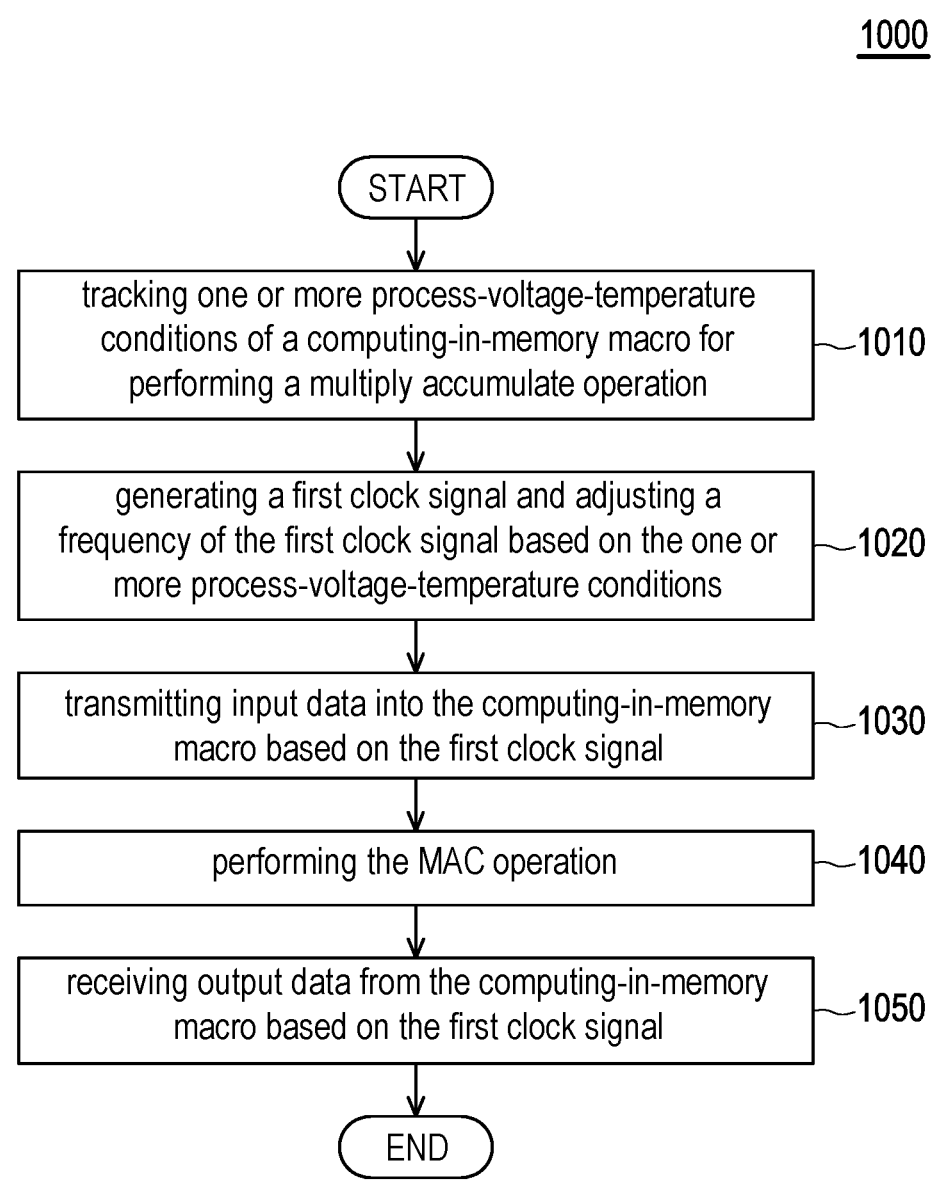
FIG. 10 is a flowchart of a method for in-memory computing, in accordance with some embodiments of the present disclosure.

FIG. 10 is a flowchart of a method 1000 for in-memory computing, in accordance with some embodiments of the present disclosure. It is understood that additional operations may be performed before, during, and/or after the method 1000 depicted in FIG. 10, and that some other processes may only be briefly described herein. The method 1000 can be performed by the memory device 100 illustrated in the embodiments of FIGS. 1-9, but the present disclosure is not limited thereto.

In operation 1010, process-voltage-temperature (PVT) dependent components (e.g., NMOS transistors and/or PMOS transistors within the delay line circuit 420 in FIG. 4) within a clock generating circuit (e.g., the clock generating circuit 140 in FIG. 2) track one or more process-voltage-temperature conditions of a computing-in-memory macro (e.g., CIM macro in FIG. 1) for performing a multiply accumulate operation.

In operation 1020, the clock generating circuit generates a first clock signal (e.g., the clock signal CLK1 in FIG. 3) and adjusts a frequency of the first clock signal to conform to an operation speed of the multiply accumulate operation based on the one or more process-voltage-temperature conditions. In some embodiments, a logic circuit in the clock generating circuit performs a NAND operation to output a first gate output signal based on an enable signal and the first clock signal, and a delay line circuit following the logic circuit delays the first gate output signal to generate the first clock signal.

In operation 1030, an input buffer circuit (e.g., the input buffer circuit 120 in FIG. 1) transmits input data from the input buffer circuit to the computing-in-memory macro based on the first clock signal. In operation 1040, the computing-in-memory macro performs the MAC operation using the input data and obtains output data. In operation 1050, an output buffer circuit receives the output data from the CIM macro based on the first clock signal.

In some embodiments, the input buffer circuit receives the input data based on a second clock signal (e.g., the clock signal CLK2 in FIG. 9) from an input channel and then provide the input data stored in the input buffer circuit to the CIM macro. In some embodiments, the output buffer circuit outputs the stored output data to an output channel based on the second clock signal. The first clock signal and the second clock signal are asynchronous clock signals.

By the operations described above, a method for in-memory computing can be performed to process MAC operations in a CIM macro with a clock generating circuit for generating a dynamically adjusted internal clock signal corresponding to PVT conditions. Accordingly, the adaptive clocking provided by the clock generating circuit can optimize the operation performance and avoid MAC operation errors due to PVT variations, which improves data transfer between the CIM macro and external circuits and also improves overall device performance.

In some embodiments, a memory device is disclosed that includes a CIM macro configured to perform in-memory computing based on a first clock signal, and a clock generating circuit arranged within the CIM macro and configured to generate the first clock signal. A frequency of the first clock signal is modified according to a condition of the computing-in-memory macro to cause the first clock signal to conform to an operation speed of the in-memory computing.

In some embodiments, a computing device is disclosed that includes a memory array including memory cells for storing data for multiply accumulate operation, a clock generating circuit configured to generate a first clock signal for performing the multiply accumulate operation, an input buffer circuit configured to receive input data from an input channel, and to output the input data to the memory array, and an output buffer circuit configured to receive output data from the memory array resulting from the multiply accumulate operation, and to output the output data to an output channel. A frequency of the first clock signal is determined based on one or more process-voltage-temperature (PVT) conditions to conform to an operation speed of the multiply accumulate operation.

In some embodiments, a method for in-memory computing is also disclosed that includes: tracking one or more process-voltage-temperature conditions of a computing-in-memory macro for performing a multiply accumulate operation; generating a first clock signal and adjusting a frequency of the first clock signal to conform to an operation speed of the multiply accumulate operation based on the one or more process-voltage-temperature conditions; and transmitting input data, by an input buffer circuit, to the computing-in-memory macro and receiving, by an output buffer circuit, output data from the computing-in-memory macro based on the first clock signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a computing-in-memory macro configured to perform in-memory computing based on a first clock signal; and
   a clock generating circuit arranged within the computing-in-memory macro and configured to generate the first clock signal, wherein a frequency of the first clock signal is modified according to a condition of the computing-in-memory macro to cause the first clock signal to conform to an operation speed of the in-memory computing; and
   an input buffer circuit configured to receive input data based on a second clock signal, and to output the input data in the computing-in-memory macro based on the first clock signal.

2. The memory device of claim 1, wherein the condition of the computing-in-memory macro comprises a process-voltage-temperature (PVT) condition.

3. The memory device of claim 1, wherein the clock generating circuit comprises one or more process-voltage-temperature (PVT) condition dependent components configured to provide a delay associated with a process-voltage-temperature (PVT) condition.

4. The memory device of claim 1, wherein the clock generating circuit comprises:

a logic circuit configured to perform a NAND operation to output a first gate output signal based on an enable signal and the first clock signal; and a delay line circuit electrically coupled to the logic circuit and configured to generate the first clock signal by delaying the first gate output signal.

5. The memory device of claim 4, wherein the delay line circuit comprises a plurality of delay elements coupled in series with each other, with a first delay element in the series receiving the first gate output signal and a last delay element in the series outputting the first clock signal.

6. The memory device of claim 1, wherein:

the input buffer circuit is coupled to the computing-in-memory macro and configured to receive the input data based on the second clock signal from an input channel.

7. The memory device of claim 1, wherein the input buffer circuit comprises a first-in-first-out buffer.

8. The memory device of claim 1, wherein the first clock signal and the second clock signal are asynchronous clock signals.

9. The memory device of claim 1, further comprising:

an output buffer circuit coupled to the computing-in-memory macro and configured to receive output data based on the first clock signal from the computing-in-memory macro, and to output the output data based on a second clock signal to an output channel.

10. The memory device of claim 9, wherein the output buffer circuit comprises a first-in-first-out buffer.

11. The memory device of claim 9, wherein the first clock signal and the second clock signal are asynchronous clock signals.

12. A computing device, comprising:

a memory array comprising a plurality of memory cells for storing data for a multiply accumulate operation;

a clock generating circuit configured to generate a first clock signal for performing the multiply accumulate operation, wherein a frequency of the first clock signal is determined based on a process-voltage-temperature (PVT) condition to conform to an operation speed of the multiply accumulate operation;

an input buffer circuit configured to receive input data from an input channel, and to output the input data to the memory array; and an output buffer circuit configured to receive output data resulting from the multiply accumulate operation from the memory array based on the first clock signal, and to output the output data to an output channel based on a second clock signal.

13. The computing device of claim 12, wherein the frequency of the first clock signal is less than or equal to the operation speed.

14. The computing device of claim 12, wherein the clock generating circuit comprises a delay line circuit, the delay line circuit comprising one or more PVT dependent components.

15. The computing device of claim 12, wherein the clock generating circuit comprises:

a logic circuit configured to perform a NAND operation to output a NAND gate output signal based on an enable signal and the first clock signal; and a plurality of delay elements coupled in series with each other, with a first delay element in the series receiving the NAND gate output signal and a last delay element in the series outputting the first clock signal.

16. The computing device of claim 12, wherein:

the input buffer circuit is configured to receive input data based on the second clock signal, and to output the input data based on the first clock signal for performing the multiply accumulate operation, the first clock signal and the second clock signal being asynchronous clock signals.

17. A method for in-memory computing, comprising:

tracking a process-voltage-temperature condition of a computing-in-memory macro for performing a multiply accumulate operation;

generating a first clock signal and adjusting a frequency of the first clock signal to conform to an operation speed of the multiply accumulate operation based on the process-voltage-temperature condition;

receiving input data, by an input buffer circuit, based on a second clock signal from an input channel, wherein the first clock signal and the second clock signal are asynchronous clock signals; and transmitting the input data, by the input buffer circuit, to the computing-in-memory macro and receiving, by an output buffer circuit, output data from the computing-in-memory macro based on the first clock signal.

18. The method of claim 17, wherein generating the first clock signal comprises:

performing, by a logic circuit, a NAND operation to output a first gate output signal based on an enable signal and the first clock signal; and delaying, by a delay line circuit, the first gate output signal to generate the first clock signal.

19. The method of claim 17, further comprising:

outputting the output data received by the output buffer circuit to an output channel based on the second clock signal.

20. The method of claim 17, wherein the frequency of the first clock signal is less than or equal to the operation speed.

* * * * *